United States Patent
Engl et al.

(10) Patent No.: US 8,439,529 B2
(45) Date of Patent: May 14, 2013

(54) LIGHTING DEVICE, AUTOMOTIVE HEADLIGHTS AND METHOD FOR PRODUCING A LIGHTING DEVICE

(75) Inventors: Moritz Engl, Regensburg (DE); Stefan Grötsch, Lengfeld/Bad Abbach (DE); Markus Hofmann, Bad Abbach (DE); Rainer Huber, Laberweinting (DE); Kurt-Jürgen Lang, Regen (DE); Joachim Reill, Zeitlarn (DE); Michael Sailer, Wolfskofen (DE); Mario Wanninger, Harting (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 574 days.

(21) Appl. No.: 11/718,009

(22) PCT Filed: Oct. 20, 2005

(86) PCT No.: PCT/DE2005/001874
§ 371 (c)(1),
(2), (4) Date: Jun. 17, 2009

(87) PCT Pub. No.: WO2006/045277
PCT Pub. Date: May 4, 2006

(65) Prior Publication Data
US 2009/0251918 A1  Oct. 8, 2009

(30) Foreign Application Priority Data

Oct. 29, 2004  (DE) .......................... 10 2004 052 687
Nov. 22, 2004  (DE) .......................... 10 2004 056 252

(51) Int. Cl.
*F21V 5/02*  (2006.01)

(52) U.S. Cl.
USPC .......................................... 362/340; 362/353

(58) Field of Classification Search .................. 362/340, 362/353, 338, 335–336, 317
See application file for complete search history.

(56) References Cited

U.S. PATENT DOCUMENTS

| 4,964,025 A | 10/1990 | Smith |
| 5,040,868 A | 8/1991 | Waitl et al. |
| 5,913,002 A | 6/1999 | Jiang |
| 5,943,586 A * | 8/1999 | Koizumi et al. ............... 438/401 |

(Continued)

FOREIGN PATENT DOCUMENTS

| DE | 68923240 | 11/1995 |
| DE | 69803297 | 8/2002 |

(Continued)

OTHER PUBLICATIONS

Schnitzer, I. et al., "30% External Quantum Efficiency from Surface Textured, Thin-film Light-emitting Diodes", *Appl. Phys. Lett.*, vol. 63, No. 16, pp. 2174-2176, 1993.

(Continued)

*Primary Examiner* — Julie Shallenberger
(74) *Attorney, Agent, or Firm* — Fish & Richardson P.C.

(57) ABSTRACT

Disclosed is a lighting device comprising at least one LED and at least one optical element, wherein the LED and the optical element are aligned with each other by means of at least one dowel pin. A method of making such a lighting device is also specified. The described lighting device is particularly well suited for use in a vehicle headlight.

25 Claims, 9 Drawing Sheets

U.S. PATENT DOCUMENTS

| | | | |
|---|---|---|---|
| 6,066,861 | A | 5/2000 | Höhn et al. |
| 6,097,549 | A | 8/2000 | Jenkins et al. |
| 6,402,347 | B1 | 6/2002 | Maas et al. |
| 6,534,159 | B1 * | 3/2003 | Newman et al. .............. 428/209 |
| 7,349,163 | B2 * | 3/2008 | Angelini et al. .............. 359/708 |
| 7,938,559 | B2 | 5/2011 | Angelini et al. |
| 2002/0034078 | A1 * | 3/2002 | Natsume ........................ 362/509 |
| 2002/0094175 | A1 * | 7/2002 | Oskarsson ........................ 385/88 |
| 2002/0113244 | A1 | 8/2002 | Barnett et al. |
| 2002/0149312 | A1 | 10/2002 | Roberts et al. |
| 2003/0156416 | A1 * | 8/2003 | Stopa et al. ................... 362/294 |
| 2004/0029436 | A1 | 2/2004 | Gasquet et al. |
| 2004/0057252 | A1 | 3/2004 | Coushaine |
| 2004/0149998 | A1 * | 8/2004 | Henson et al. ................... 257/98 |
| 2004/0183081 | A1 | 9/2004 | Shishov et al. |
| 2004/0184737 | A1 | 9/2004 | Oono et al. |
| 2007/0008734 | A1 | 1/2007 | Bogner et al. |

FOREIGN PATENT DOCUMENTS

| | | |
|---|---|---|
| DE | 10227753 | 1/2004 |
| DE | 10314524 | 10/2004 |
| DE | 602004004078 | 8/2007 |
| DE | 60219075 | 12/2007 |
| JP | 11-30799 | 2/1999 |
| JP | 2002-299700 | 10/2002 |
| JP | 1022787 | 5/2003 |
| JP | 2003-178612 | 6/2003 |
| JP | 2004/6364 | 1/2004 |
| JP | 2004-207240 | 7/2004 |
| JP | 2004-526307 | 8/2004 |
| JP | 2006-521667 | 9/2006 |
| JP | 7-25499 | 2/2007 |
| WO | WO 98/12757 | 3/1998 |
| WO | WO 99/44087 | 9/1999 |
| WO | 02/061805 | 8/2002 |
| WO | WO 03/048637 | 6/2003 |
| WO | WO 2004/001459 | 12/2003 |
| WO | WO 2004/066002 | 5/2004 |
| WO | WO 2004/088200 | 10/2004 |
| WO | WO 2005/062089 | 7/2005 |

OTHER PUBLICATIONS

Authorized officer: Verbandt, Y., International Search Report, PCT/DE2005/001874, Apr. 20, 2006.

English translation of examination report for Japanese application No. 2007-538261, dated Jan. 7, 2011.

International Preliminary Report on Patentability for Application No. PCT/DE2005/001874 dated May 1, 2007.

Translation of the Decision of Refusal for Japanese Patent Application No. 2007-538261 dated Feb. 3, 2012.

English translation of office action issued in Korean application No. 10-2007-7012076, dated Aug. 26, 2011.

English translation of examination report for Japanese Application No. 2007-538261, dated Aug. 17, 2011.

Examination Report, Board of Appeal's Request for Written Argument from the Japanese Patent Office dated Aug. 29, 2012.

* cited by examiner

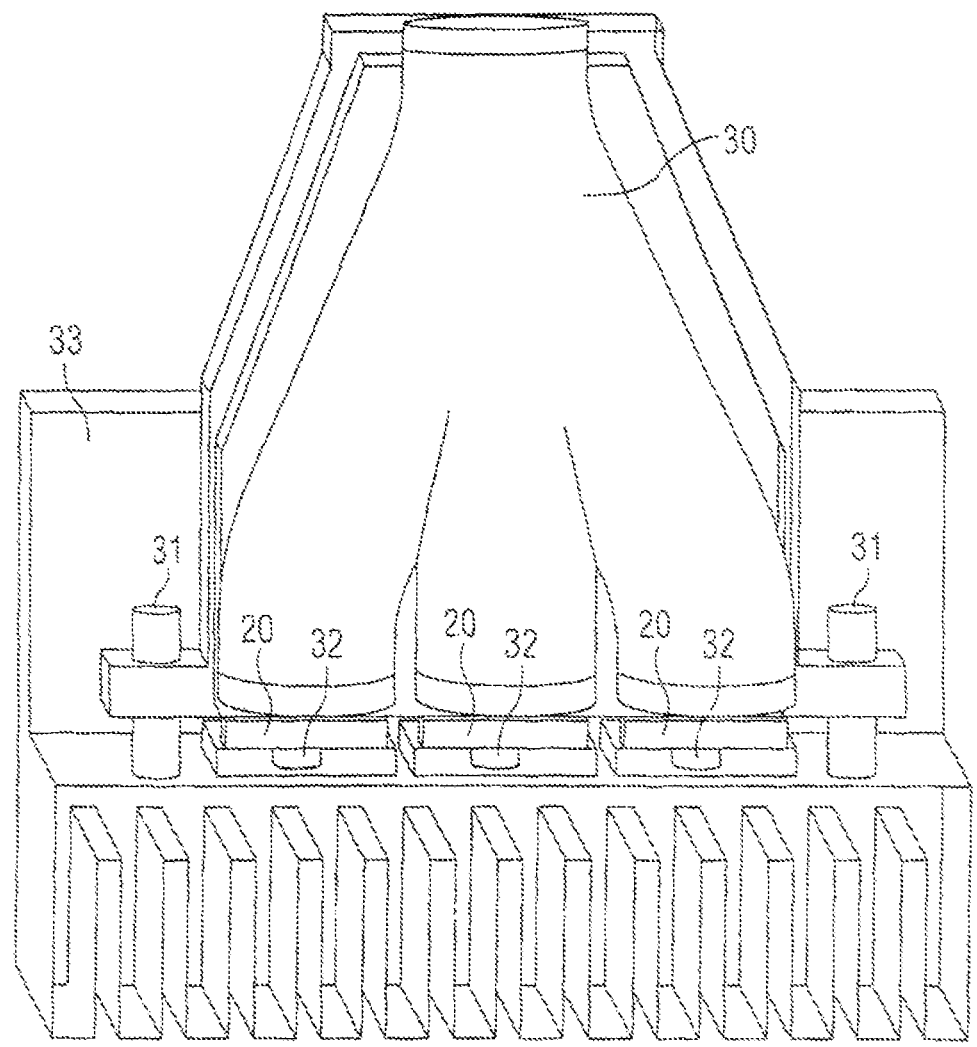

LIGHTING DEVICE, AUTOMOTIVE HEADLIGHTS AND METHOD FOR PRODUCING A LIGHTING DEVICE

CROSS-REFERENCE TO RELATED APPLICATIONS

This application is the National Stage of International Application No. PCT/DE2005/001874, filed on Oct. 20, 2005, which claims the priority of German Patent Application Serial No. 10 200452687.7, filed on Oct. 29, 2004 and Ser. No. 10 2004056252.0, filed on Nov. 22, 2004. The contents of all applications are hereby incorporated by reference in their entireties.

BACKGROUND

The invention relates to a lighting device. The invention farther relates to a method of making a lighting device. The invention additionally relates to a vehicle headlight.

SUMMARY

It is an object of the present invention to specify a lighting device that is particularly versatile. It is a further object of the present invention to specify a method of making such a lighting device. Finally, it is an object of the invention to specify a vehicle headlight comprising such a lighting device.

A lighting device is specified.

According to at least one embodiment of the lighting device, the lighting device comprises at least one light-demitting diode (LED). The lighting device preferably comprises a plurality of LEDs. It is additionally possible for the lighting device to include other light-generating components besides the LEDs, such as for example halogen lamps or glow-discharge lamps.

According to at least one embodiment of the lighting device, the lighting device further comprises an optical element. This optical element can be a refractive or a diffractive optic. It is also possible, however, for the optical element to be a reflective optic. The optical element can further be a combination of the aforesaid optics.

The optical element is preferably disposed after at least one LED in such a way that at least a portion of the light emitted by the LED is influenced in a defined manner by said optical element.

According to at least one embodiment of the lighting device, it is possible for each LED to be assigned one-to-one to exactly one optical element. That is, the optical element primarily influences the light emitted by that LED.

According to at least one embodiment of the lighting device, a common optical element is disposed after a plurality of LEDs. That is, the optical element influences the light from a plurality of LEDs assigned to said optical element. In particular, it is possible for exactly one common optical element to be disposed after all the LEDs of the lighting device.

According to at least one embodiment of the lighting device, at least one LED and one optical element are aligned with each other by means of at least one dowel pin, i.e., the mutually relative positions of the LED and the optical element are fixed by means of a dowel pin. The LED and the optical element are preferably aligned with each other by means of a plurality of dowel pins.

The LED and the optical element can at the same time be mounted on a common carrier. It is then possible for the position of the optical element relative to the LED to be determined by means of at least one dowel pin that connects the optical element and the carrier to each other. It is further possible for the LED to be aligned with the optical element by means of a dowel pin that connects the carrier and LED to each other. It is also possible for both the LED and the optical element to be connected to the earner by means of at least one dowel pin each. The LED and the optical element are then aligned with the carrier and thus with each other by means of these dowel pins.

According to at least one embodiment of the lighting device, a lighting device is specified that comprises at least one LED and at least one optical element, said LED and said optical element being aligned with each other by means of at least one dowel pin.

In at least one embodiment of the lighting device, at least a portion of the optical element is formed by a fiber optic. That is, at least a portion of the optical element contains a light guide.

The light from an LED preferably couples into at least one fiber of the fiber optic. If the LED for example contains a plurality of LED chips, then the light from each LED chip preferably couples into exactly one fiber of the fiber optic. For example, an additional optical element can be disposed after the portion of the fiber optic through which the electromagnetic radiation generated by the LED leaves the optic. This additional optical element can be formed, for example, by a refractive or a diffractive lens.

In at least one embodiment of the lighting device, the dowel pin has two bases connected to each other by a lateral surface. The bases of the dowel pin preferably have the same size and shape. The lateral surface is preferably configured as smooth and connects the two bases along a straight line. The lateral surface is preferably perpendicular to the two planes spanned by the two bases of the dowel pin. The dowel pin has for example one of the following shapes: cylinder, cuboid.

According to at least one embodiment the dowel pin engages at least one of its ends in a recess. That is, the recess is suitable for receiving the dowel pin. The edge of the recess preferably has the same shape as the base of the end of the dowel pin that engages in the recess. If the dowel pin is cylindrical, for example, then the recess is preferably a circular hole.

The opening of the recess is preferably dimensioned, such that the dowel pin engages snugly in the recess. For example, the dowel pin fits positively into the recess. The dowel pin is then, for example, pluggable into the recess.

It is also possible, however, for the opening of the recess to be configured as slightly narrower than the base of the end of the dowel pin that engages in the recess. The dowel pin can then be pressed into the recess. This press fit then simultaneously brings about mechanical fixation. That is, the optical element can be mechanically connected to the carrier by means of the dowel pin. According to at least one embodiment of the lighting device, the dowel pin is a separate component. The dowel pin preferably then engages at each of its two ends in a respective recess. For example, for this purpose one recess is provided in the optical element and another recess is provided in the carrier to which the optical element is connected.

According to at least one embodiment, the dowel pin is an integral part of the optical element, i.e., the dowel pin is fixedly connected at one end to the optical element. For example, the dowel pin can be manufactured as part of the optical element as early as during the production of the optical element. The dowel pin can for example be formed, injection-molded or glued onto the optical element or configured in one piece with the optical element.

In this case, the carrier to which the optical element is connected, and on which for example an LED is arranged, comprises a recess suitable for receiving the dowel pin.

According to at least one embodiment, it is also possible, however, for the dowel pin to be an integral part of the carrier. In this case, the dowel pin can be co-manufactured as part of the carrier as early as during the production of the carrier. For example, the dowel pin can be formed, injection-molded or glued onto the carrier or configured as part of the carrier in one piece therewith. The optical element preferably then comprises a recess suitable for receiving the dowel pin.

According to at least one embodiment, the LED is arranged on the carrier. It is possible in this ease for the LED and the earner to be aligned with each other by means of at least one dowel pin. If a plurality of LEDs is arranged on the carrier, the LEDs can be aligned with the carrier and therefore also with each other by means of dowel pins.

According to at least one embodiment of the lighting device, a dowel pin is an integral part of the LED. The dowel pin can then be co-manufactured as part of the LED as early as during the production of the LED. For example, the dowel pin can be formed, injection-molded or glued onto the LED or configured as part of the LED in one piece therewith. The carrier preferably then comprises a recess suitable for receiving the dowel pin of the LED.

According to at least one embodiment, the dowel pin is an integral part of the carrier. Here again, the dowel pin can be fabricated as part of the carrier. For example, the dowel pin can be formed, injection-molded or glued onto the carrier or configured as part of the carrier in one piece therewith. The LED preferably then comprises a recess suitable for receiving the dowel pin of the carrier.

Furthermore, according to at least one embodiment of the lighting device, it is possible for the carrier and the LED each to comprise at least one recess suitable for receiving a separate respective dowel pin. The carrier and the LED are then aligned with each other by means of this dowel pin.

According to at least one embodiment of the lighting device, the LED and the carrier are aligned with each other by means of at least one register mark. The register mark is, for example, a marking on an outer surface of the LED. The carrier preferably also has at least one register mark. The carrier and the LED can be aligned relative to each other by positioning the register marks on the LED and the carrier, for example via an optical image recognition process.

According to at least one embodiment of the lighting device, the LED comprises at least one LED chip. An LED optic is preferably disposed after the LED chip. Particularly preferably, the LED comprises a plurality of LED chips after which a common LED optic is disposed. The LED optic is preferably positioned relative to the LED chips such that the bulk of the electromagnetic radiation emitted by the LED chips is influenced by the LED optic. The LED optic preferably includes at least one of the following optical elements: a refractive optic, a diffractive optic, a reflective optic, a fiber optic.

According to at least one embodiment of the lighting device, the LED optic is suitable for reducing the divergence of the light emitted by the LED chips. That is, the light emitted by the LED chips is influenced, for example, as it passes through the LED optic, in such a way that its divergence after leaving the LED optic is lower than it was before entering it.

In at least one embodiment of the lighting device, the LED optic is a non-imaging optical concentrator. In this case, the LED optic is preferably disposed after the radiation outcoupling surface of at least one LED chip, in such a way that the radiation entrance opening of the optical element is in effect the radiation exit opening of the concentrator. That is, the LED optic tapers in the direction of the LED chip. In this fashion, electromagnetic radiation passing into the LED optic through the radiation entrance opening leaves the concentrator through the radiation exit opening with reduced divergence.

The LED optic can be formed at least partially in the manner of one of the following optical elements: a Compound Parabolic Concentrator (CPC), a Compound Elliptical, Concentrator (CEC), a Compound Hyperbolic Concentrator (CMC).

The LED optic can have reflective side walls suitable for reflecting at least a portion of the electromagnetic radiation emitted by the LED chip. The side walls are then formed at least partially in the manner of one of the above-cited optical elements.

According to at least one embodiment of the lighting device, the non-imaging optical concentrator has side walls that connect the radiation entrance opening to the radiation exit opening of the LED optic and are configured such that connecting lines extending along the side walls and between the radiation entrance opening and the radiation exit opening extend substantially rectilinearly. The side walls form, for example, the shape of a truncated pyramid or a truncated cone.

The LED optic can in this ease be a solid body made of a dielectric material. The electromagnetic radiation passing into the LED optic through the radiation entrance opening is then preferably reflected into the surrounding medium by the lateral boundary surfaces of the solid body.

In at least one embodiment of the lighting device, exactly one LED optic is assigned to each LED chip. The radiation entrance opening of the optical element is preferably disposed alter the radiation outcoupling surface of the LED chip in a main emission direction of the LED chip.

It is also possible, however, for a plurality of LED chips to be assigned to a common LED optic. For this purpose, the LED chips can be arranged, for example, along at least one straight line. The radiation entrance opening of the optical element is then disposed after the entire area of the radiation outcoupling surfaces of the individual LED chips, in a main emission direction of the LED chips.

According to at least one embodiment, the radiation entrance opening of the LED optic has a cross-sectional area that is no more than twice as large as the total radiation outcoupling area of the LED chip assigned to the optical element. The total radiation outcoupling area is given by the sum of the radiation outcoupling areas of the individual LED chips assigned to the LED optic. The area of the radiation entrance opening is preferably no more than 1.5, particularly preferably no more that 1.25 times, as large as the total radiation outcoupling area of the LED chips assigned to the LED optic.

Such a small radiation entrance opening makes it possible for the size of the solid angle within which the electromagnetic radiation is emitted to be reduced as close as possible to the radiation outcoupling area. The cross-sectional area of the beam cone emitted by the LED chip is especially small at mat location. This makes it possible to build components of optimized etendue. That is to say, the highest possible radiation intensity is projected onto the smallest possible area. Etendue is a conserved quantity in optics. It is given by the product of the area content of a light source and the solid angle within which the light source emits.

In at least one embodiment of the lighting device, a gap, for example an air gap, is disposed between the radiation outcoupling surface of the LED chip and the radiation entrance opening of the LED optic. This achieves the effect that particularly divergent radiation does not find its way into the LED optic, but can exit laterally through the gap before entering the LED optic. The divergence of the electromagnetic radiation emitted by the optical element can be further reduced by this means.

Instead of a gap, it is also possible, for example, for side walls disposed after the radiation outcoupling surface of the LED chip to be configured near the radiation entrance opening of the optical element such that they are absorbing or are transparent to electromagnetic radiation. What is gained in this way is that the highly divergent fraction of the electromagnetic radiation emitted by the LED chip does not pass into the optical element.

According to at least one embodiment of the LED arrangement, an additional optical element is disposed after the radiation exit opening of the optical element in the main emission direction. The additional optical element is preferably a light-refracting or Light-deflecting optic by means of which the divergence of the radiation passing through the additional optical element can be further reduced.

The LED optic preferably reduces the divergence of a beam cone passing through the radiation entrance opening in at least one spatial direction, such that the beam cone, on exiting through the radiation exit opening, has a beam spread angle of between 0 and 70°, preferably between 0 and 20°, particularly preferably between 0 and 10°, relative to a longitudinal center axis of the optical element that is perpendicular to the radiation exit surface of an LED chip assigned to the LED optic.

In at least one embodiment of the lighting device, the LED comprises a luminescence conversion material disposed after the radiation outcoupling surface of at least one of the LED chips. A luminescence conversion material is preferably disposed after the radiation outcoupling surface of each LED chip of the lighting device.

The luminescence conversion material is preferably suitable for wavelength-converting at least a portion of the electromagnetic radiation emitted by the LED chip. The radiation emitted by the LED chip preferably mixes with the wavelength-converted portion to yield white light.

It is also possible, however, for the electromagnetic radiation emitted by the LED chip to be substantially completely wavelength-converted by the luminescence conversion material. For example, in this way, radiation emitted by the LED chip and located in the invisible region of the spectrum can be converted to radiation in the visible region of the spectrum. Through the use of, for example, two different phosphors in the luminescence conversion material, white light, for example, can be generated by light mixing. Suitable phosphors for wavelength conversion are described for example in the document WO 98/12757, whose disclosure content with regard to phosphors is hereby incorporated by reference.

In at least one embodiment of the lighting device, the luminescence conversion material can be mixed into an at least partially radiation-transparent potting compound. The potting compound preferably at least partially surrounds the LED chip. The potting compound can, for example, contain epoxy materials and/or silicone materials.

The luminescence conversion material can also, however, be applied as a thin layer directly to the radiation outcoupling surface of the individual LED chip.

It is also possible for the luminescence conversion material to be at least locally present in the LED optic. For instance, the luminescence conversion material can be applied as a thin layer to side walls disposed after the radiation outcoupling surface of the LED chip. The luminescence conversion material can be distributed uniformly on the side walls. It is also possible, however, for the luminescence conversion material to be applied to defined locations on the side walls. Particularly defined conversion of the electromagnetic radiation passing through the optical element is possible in this way.

According to at least one embodiment, it is also possible for the LED to contain LED chips that emit radiation of different wavelengths. This radiation preferably then mixes to yield white light. For example, the LED can contain at least one LED chip suitable for emitting light in the red spectral region, at least one LED chip suitable for emitting light in the green spectral region, and at least one LED chip suitable for emitting light in the blue spectral region. To improve the color rendering index, the LED can additionally comprise LED chips suitable for emitting light in other regions of the spectrum, for example in the yellow region.

In at least one embodiment of the lighting device, at least one of the LED chips of the LED has a radiation outcoupling surface through which the bulk of the electromagnetic radiation emitted by the LED chip is coupled out. Particularly preferably, all of the radiation emitted by the LED chip exits through the radiation, outcoupling surface.

The radiation outcoupling surface is constituted for example by a portion of the outer surface of the LED chip. The radiation outcoupling surface is preferably constituted by a main face of the LED chip, which is disposed for example parallel to an epitaxial layer sequence of the LED chip that is suitable for generating electromagnetic radiation.

The epitaxial layer sequence can for this purpose comprise, for example, a pn junction, a double heterostructure, a single quantum well structure or, particularly preferably, a multiple quantum well structure.

In the context of this application, the term "quantum well structure" encompasses any structure in which the charge carriers undergo quantization of their energy states by confinement. In particular, the term "quantum well structure" carries no implication as to the dimensionality of the quantization. It therefore includes, among other things, quantum troughs, quantum wires and quantum dots and any combination of these structures.

The LED chip is preferably a semiconductor LED chip from which the growth substrate is at least partially removed and to whose surface facing away from the original growth substrate a carrier element is applied. The carrier element can be relatively free selected, compared to a growth substrate. Preferably, a carrier element is selected that is particularly well matched to the radiation-generating epitaxial layer sequence in terms of thermal expansion coefficient. The carrier element can further contain a material that is a particularly good thermal conductor. Such LED chips fabricated by removing the growth substrate are frequently termed "thin-film. LED chips" and are preferably distinguished by the following features:

Applied to or configured on a first main surface, facing the carrier side, of the radiation-generating epitaxial layer sequence is a reflective layer or layer sequence that reflects at least a portion of the electromagnetic radiation, generated in the epitaxial layer sequence back thereinto.

The epitaxial layer sequence preferably has a thickness of no more than 20 µm, particularly preferably of no more than 10 µm.

The epitaxial layer sequence further preferably comprises at least one semiconductor layer with, at least one area possessing an intermixing structure. In the ideal case, this intermixing structure brings about a nearly ergodic distribution of the light in the epitaxial layer sequence, i.e., it has a stochastic scattering behavior that is as ergodic as possible.

A basic principle of a thin-film LED chip is described for example in I. Schnitzer et al, Appl. Phys, Lett. 63:16 (Oct. 18, 1993), 2174-2176, whose disclosure content in regard to the basic principle of a thin-film LED chip is hereby incorporated by reference.

Preferably all of the LED chips of the lighting device are thin-film LED chips.

Further specified is a vehicle headlight comprising at least one of the above-described lighting devices. The vehicle headlight can further include a housing in which at least one of the above-described lighting devices is disposed. The housing can, for example, be part of an auto body. The vehicle headlight can further include a transparent cover plate or a headlight optic that is disposed after the above-described lighting device in its main emission direction.

A method of making a lighting device is also specified.

According to at least one embodiment of the method of making a lighting device, an optical element and an LED are aligned with each other by means of at least one dowel pin.

By means of the method, it is possible to position an optical element and an LED relative to each other in a predefinable manner.

To this end, the dowel pin is for example pushed or pressed into a recess provided for the dowel pin. For example, the LED is mounted for this purpose on a carrier. The optical element, the carrier, or the optical element and the carrier then each have a recess suitable for receiving a dowel pin. Said dowel pin is either an integral part of the carrier or of the optical element, or is a separate component. By means of the dowel pin, it is possible to position the optical element and the carrier relative to each other and thus to mutually align the optical element and the LED mounted on the carrier.

According to at least one embodiment of the method, an LED and the carrier are aligned with each other by means of a dowel pin. Here again, it is possible for the dowel pin to be an integral part of one of the two components. It is also possible for the dowel pin to be a separate component. The LED and the carrier then comprise recesses suitable for receiving the dowel pin.

By means of the method, the LED and the earner can be positioned relative to each other in a predefinable manner. If plural LEDs and a carrier are aligned with each other, then alignment of the LEDs is also effected by means of the dowel pin.

In at least one embodiment of the method, an LED and the carrier are aligned with each other by means of a register mark. The LED and the carrier are each provided for this purpose with at least one register mark. The register marks of the two components are, for example, positioned in relation to each another by means of an optical image processing system. The register marks can be markings, such as for example a color marking applied to the outer surfaces of the LED and the carrier. It is also possible, however, for a given element of a component to function as a register mark. For instance, a given LED chip of the LED can serve as a register mark.

According to at least one embodiment of the method of making the lighting device, the attachment of an LED to the carrier takes place only after the mutual alignment of the LED and the carrier and of the optical element and the LED. For this purpose, the LED can be attached to the carrier by means of a UV-hardening adhesive that hardens only after the mutual alignment of the components has been completed.

The lighting device described herein is explicated in more detail below with reference to exemplary embodiments and the corresponding figures.

In the exemplary embodiments and figures, like or like-acting elements are each provided with the same respective reference numerals. The illustrated elements are not to be considered true to scale, but rather, individual elements may be depicted as exaggeratedly large for the sake of better understanding.

BREIF DESCPRIPTION OF THE DRAWINGS

Figure 4A:
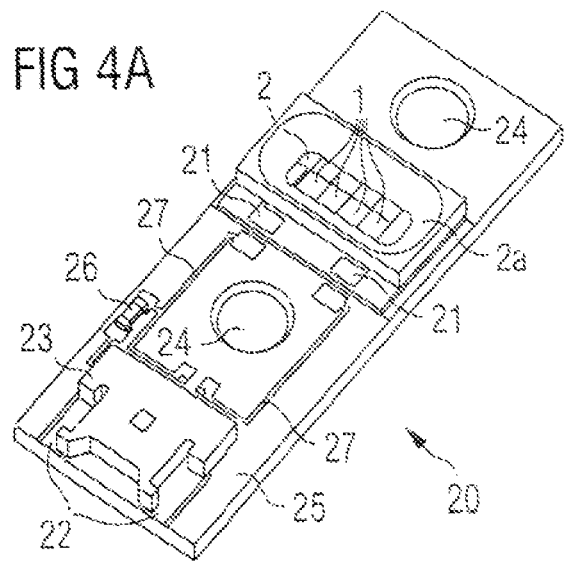

FIG. 4*a* is a perspective view of an LED according to a third exemplary embodiment of the LED.

Figure 4B:
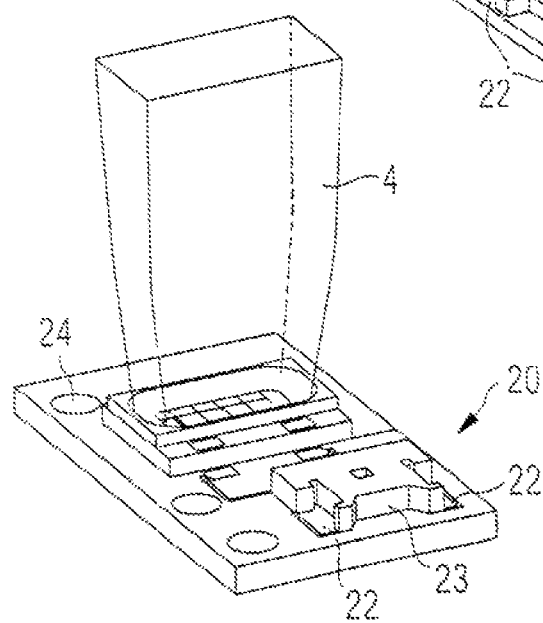

FIG. 4*b* is a perspective representation of the third exemplary embodiment of the LED comprising an LED optic.

Figure 5A:
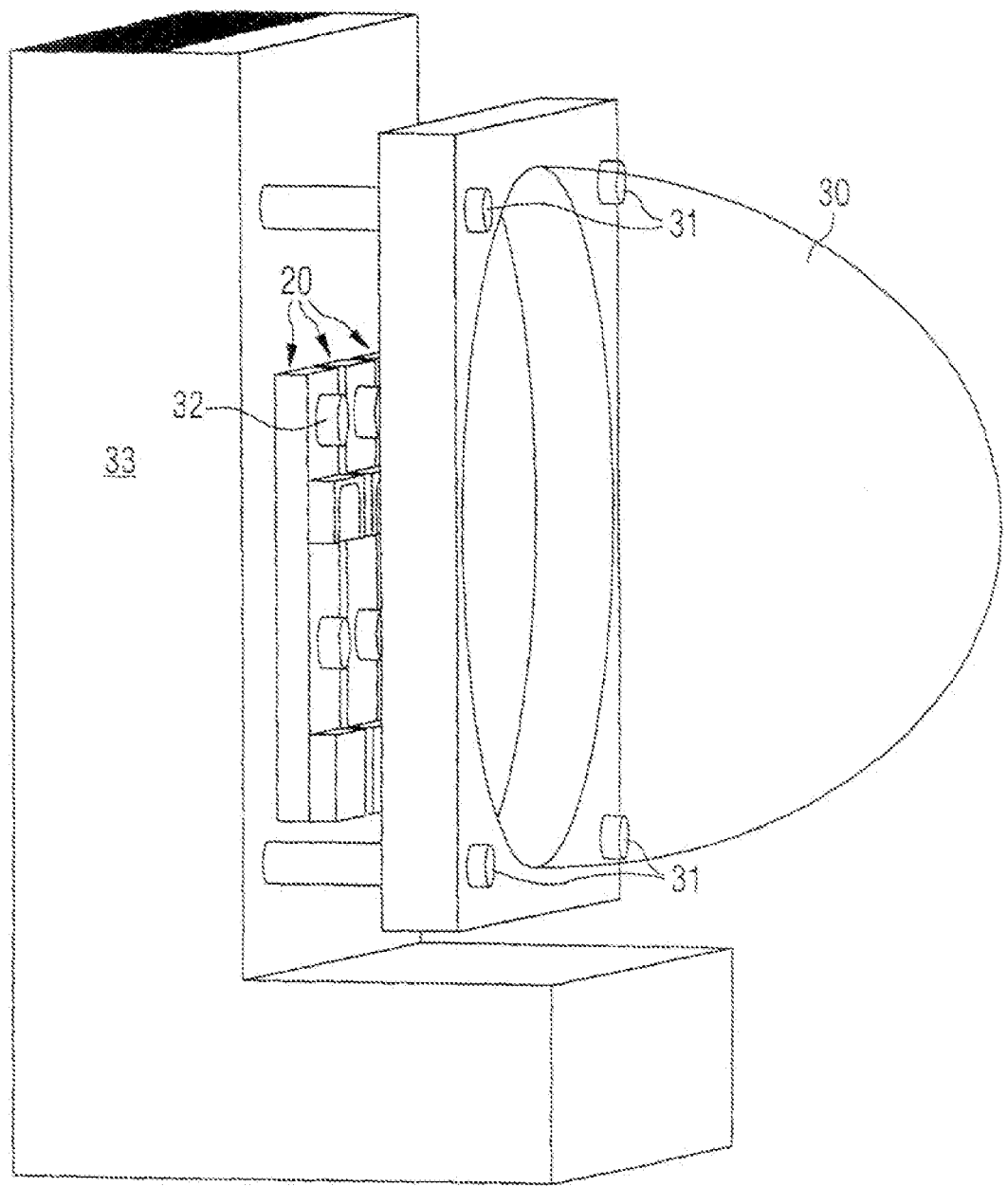

FIG. 5*a* is a perspective side view of a first exemplary embodiment of the lighting device.

Figure 5B:
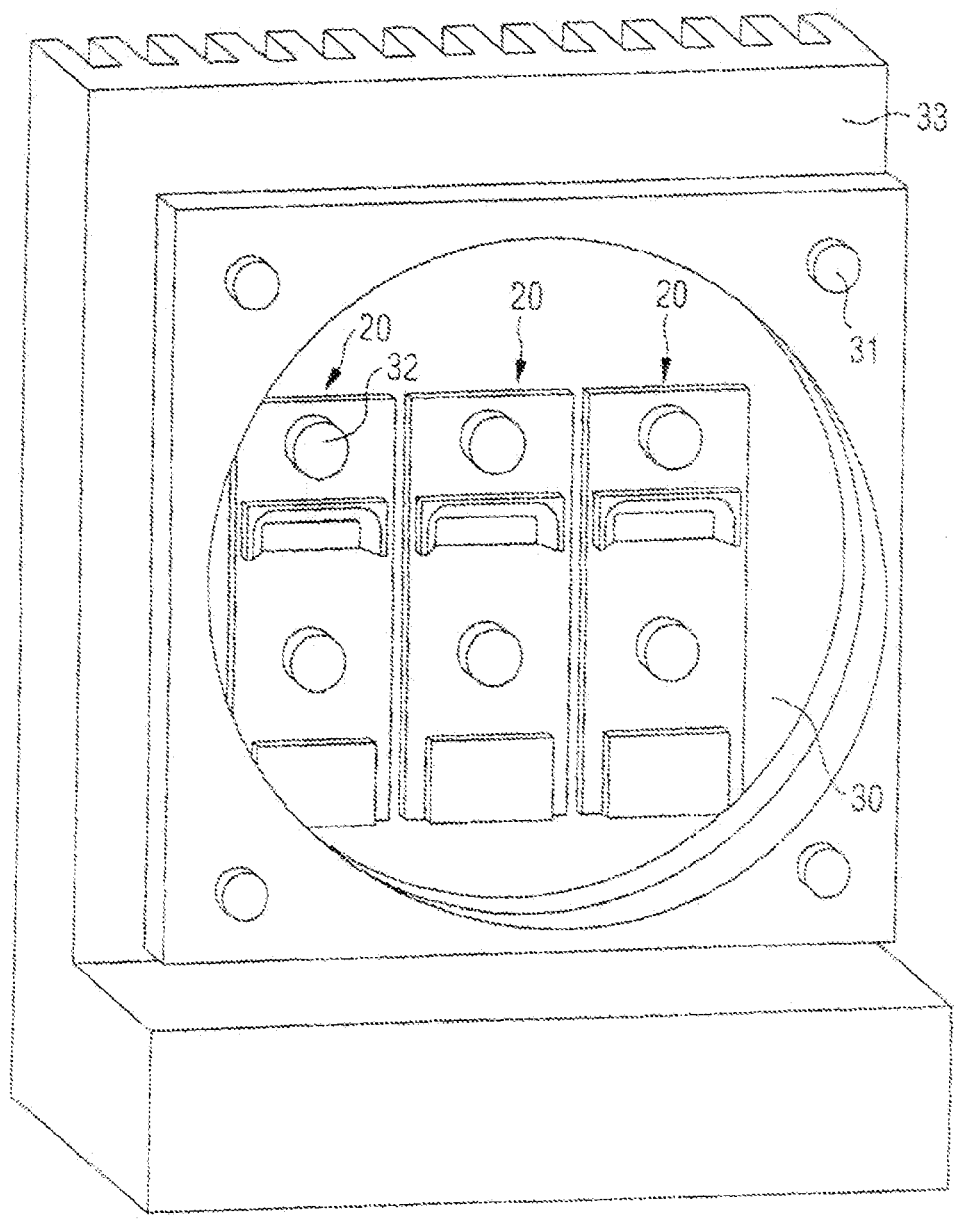

FIG. 5*b* is a perspective front view of the first exemplary embodiment of the lighting device.

Figure 6A:
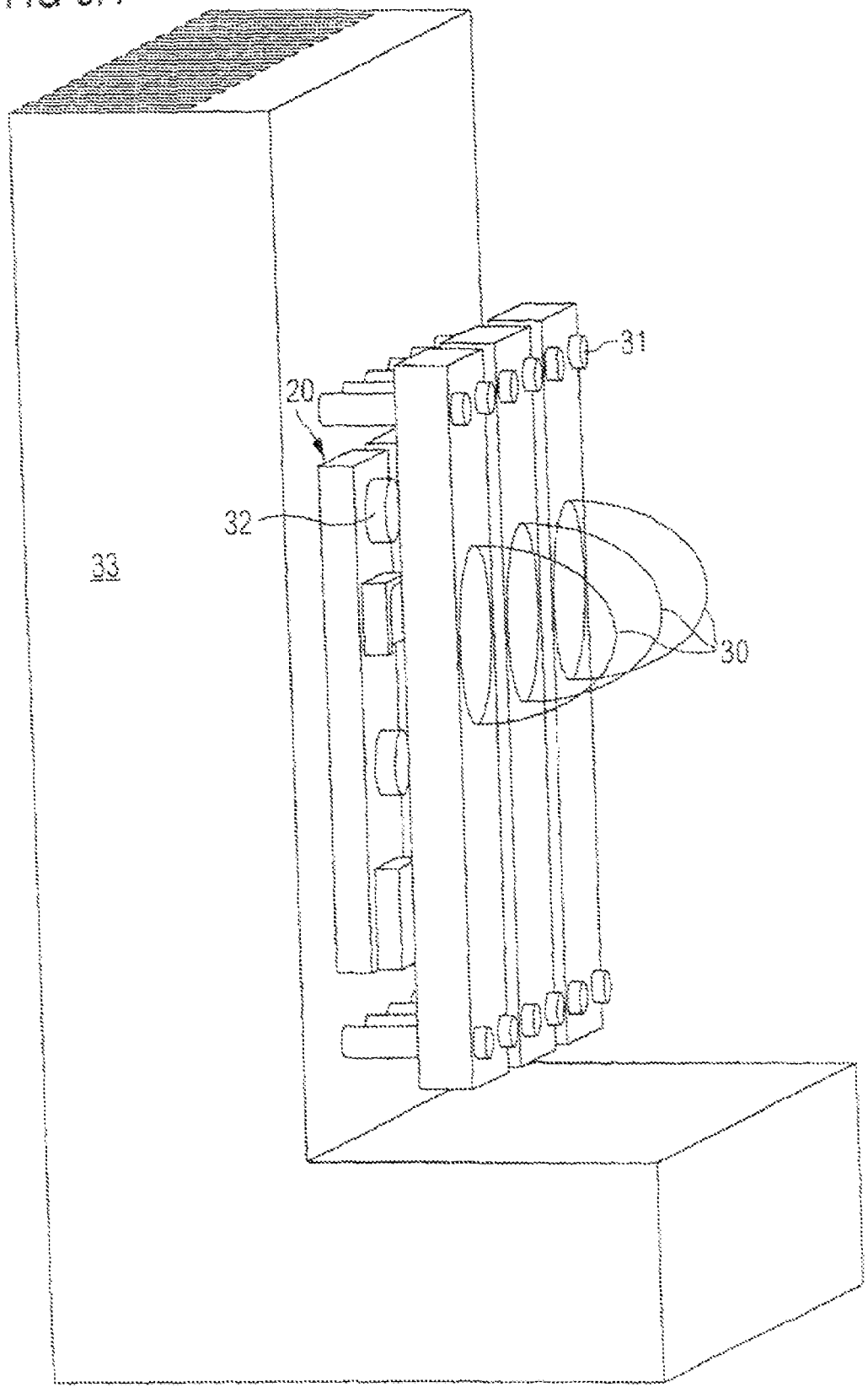

FIG. 6*a* is a perspective side view of a second exemplary embodiment of the lighting device.

Figure 6B:
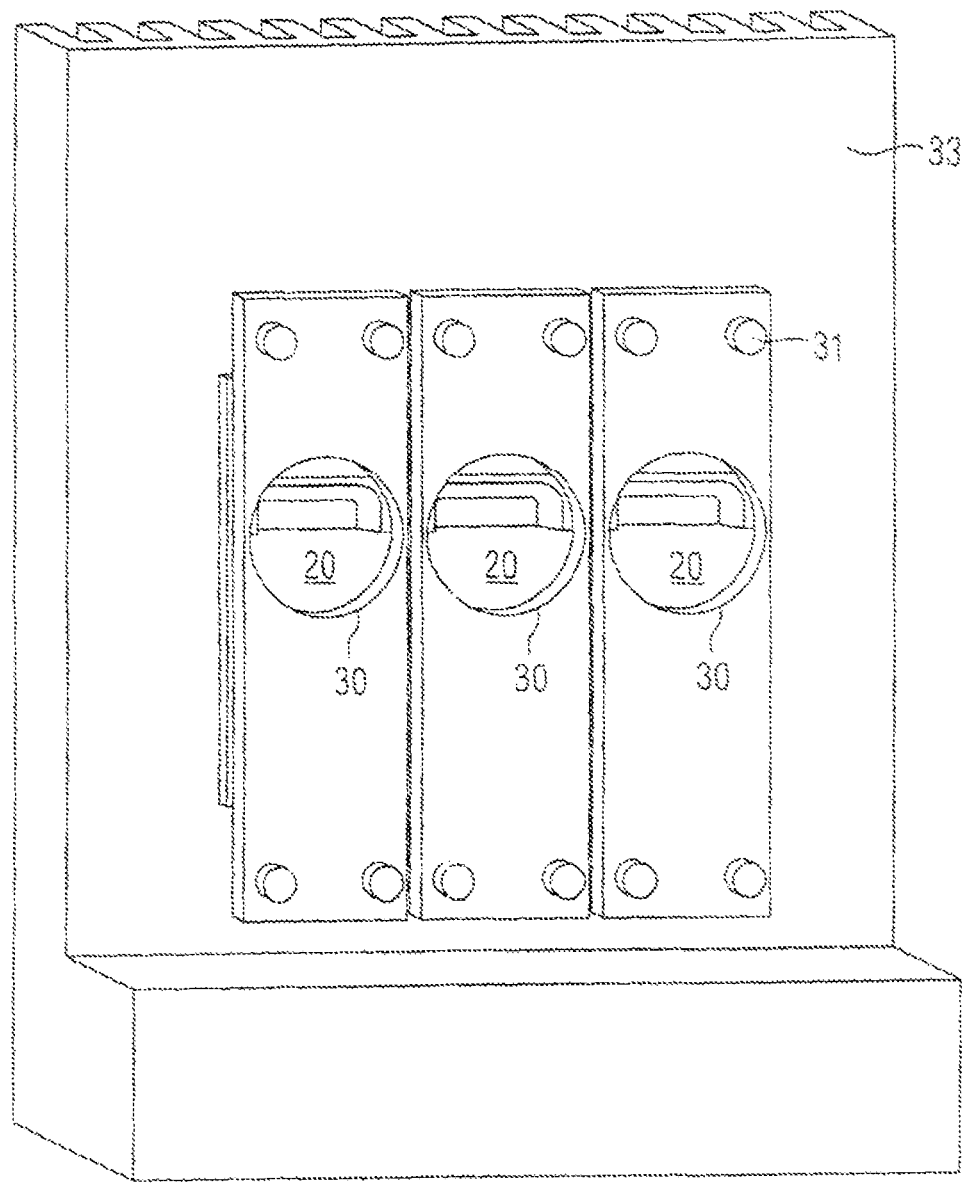

FIG. 6*b* is a perspective front view of the second exemplary embodiment of the lighting device.

Figure 7A:
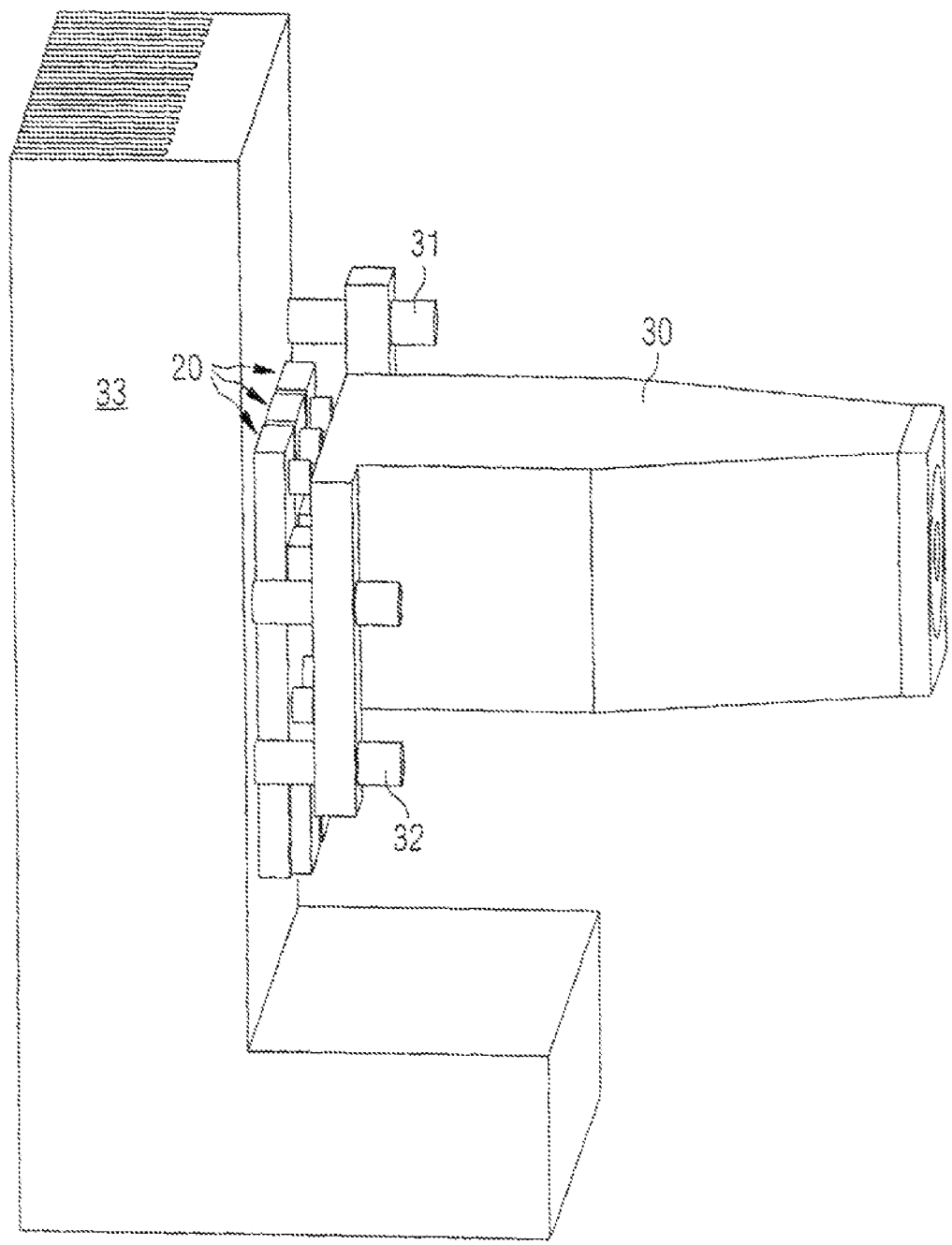

FIG. 7*a* is a perspective side view of a third exemplary embodiment of the lighting device.

FIG. 7*b* is a perspective front view of the third, exemplary embodiment of the lighting device.

Figure 8A:
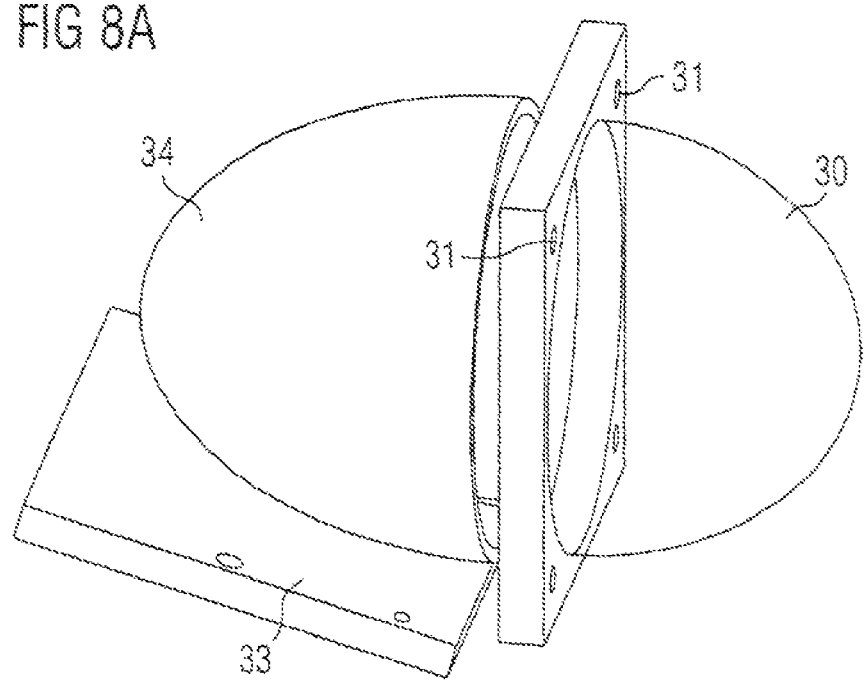

FIG. 8*a* is a perspective side view of a fourth exemplary embodiment of the lighting device.

Figure 8B:
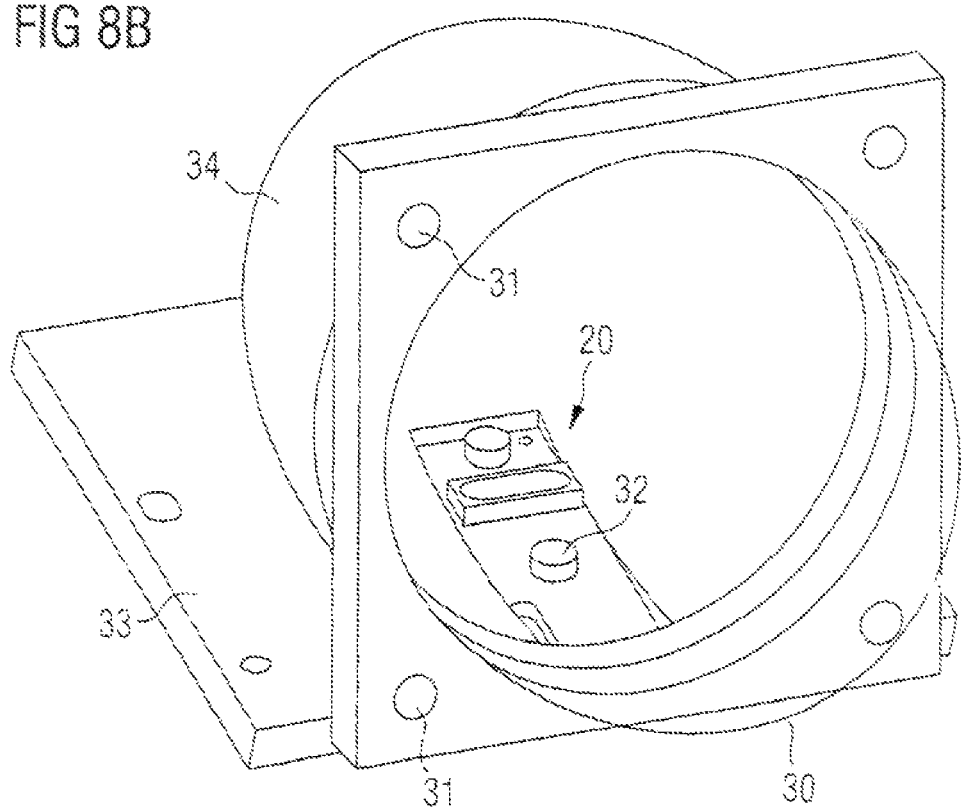

FIG. 8*b* is a perspective front view of the fourth exemplary embodiment of the lighting device.

DETAILED DESCRIPTION

Figure 1:
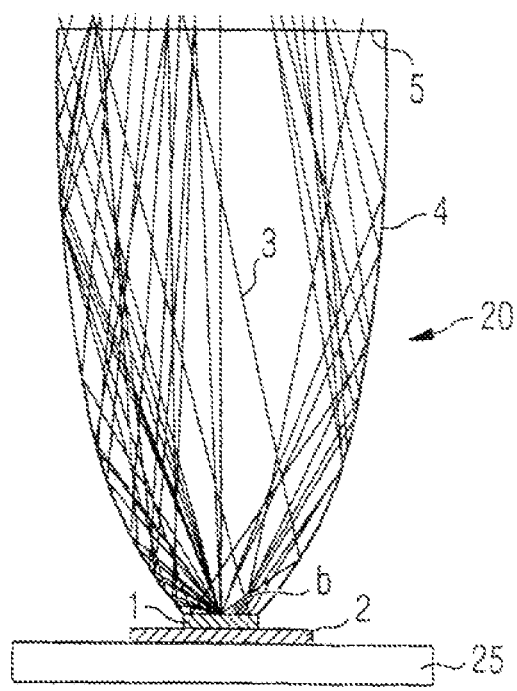
FIG. 1 is a schematic sectional representation of an LED comprising an LED optic, according to a first exemplary embodiment of the LED.

FIG. 1 is a schematic sectional representation of an LED 20 comprising an LED optic 4 according to a first exemplary embodiment of the LED 20.

The LED chip 1 is here mounted on a carrier 2. The carrier 2 can, for example, contain a ceramic material. The carrier 2 for example comprises through-contacts for contacting the LED chip 1. In the exemplary embodiment shown, the carrier 2 is mounted on a circuit board 25. The circuit board 25 for example comprises conduction paths and terminal pads for contacting the LED chip 1.

The LED chip 1 is, for example, a thin-Elm LED chip, as explained in the general part of the description.

Disposed after the LED chip 1 is an LED optic 4, which can be, for example, a three-dimensional, CPC-type, non-imaging optical concentrator. Said LED optic 4 comprises a light entrance opening b through which the electromagnetic radiation 3 emitted by the LED chip 1 can pass. The electromagnetic radiation 3 is reflected at least partially from the side walls of the LED optic 4, which is preferably provided for this purpose with a reflective coating. The radiation 3 then leaves the LED optic through the radiation exit opening 5.

The nearer the radiation entrance opening b of the LED optic 4 is brought to the radiation outcoupling surface of the LED chip 1, the smaller the radiation entrance opening b can be made to be, and the higher is the radiation density (etendue) of the electromagnetic radiation 3 exiting through radiation exit opening 5. The LED optic 4 and the LED chip 1 together form the LED 20.

Alternatively to the exemplary embodiment illustrated in FIG. 1, it is possible for a plurality of LED chips to be arranged for example along a straight line on the carrier 2, and for a common LED optic 4 to be assigned to these LED chips (see also FIGS. 4a and 4b).

Figure 2:
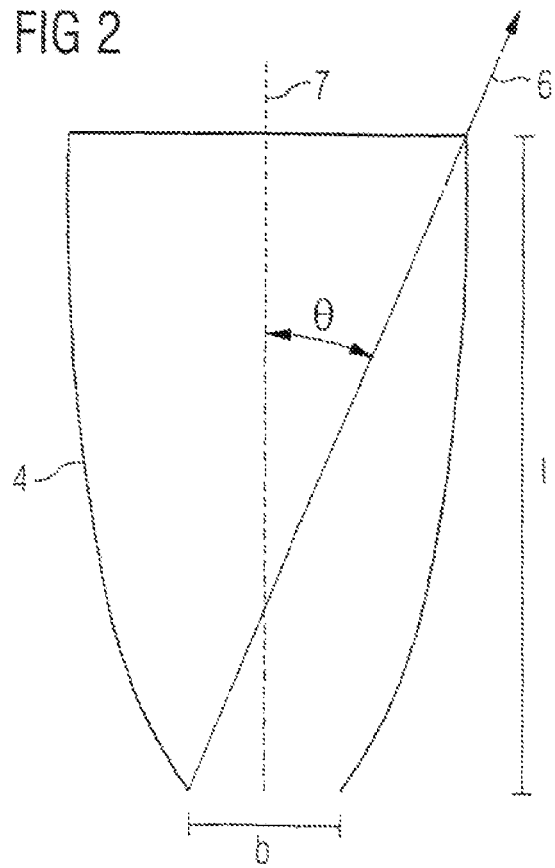
FIG. 2 is a schematic sketch describing the manner of operation of a non-imaging optical concentrator.

FIG. 2 shows that the beam cone 6 of the radiation passing through the LED optic 4 leaves the radiation exit opening 5 at a maximum angle θ to a center axis 7 of the LED optic 4. For a given width of radiation entrance opening b, the length l of the LED optic 4 determines angle θ. The following relation, for example, is obtained for an ideal compact parabolic concentrator:

$$l = \frac{b}{2}(1 + \sin\theta)\frac{\cos\theta}{\sin^2\theta},$$

To obtain a maximum beam spread angle of, for example, θ=9°, the length l of the LED optic must be approximately 23 times the width of radiation entrance opening b.

Figure 3:
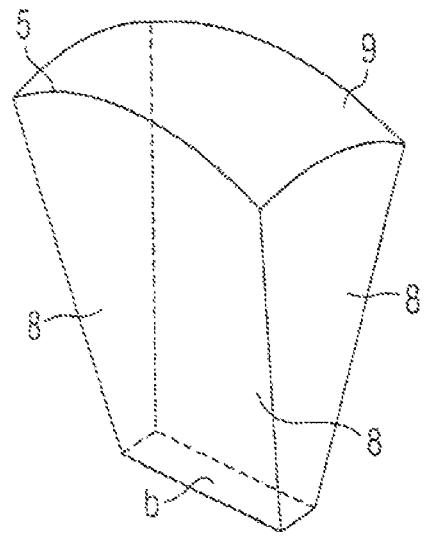
FIG. 3 is a schematic sectional representation of an LED optic according to a second exemplary embodiment of the LED.

FIG. 3 shows that as an alternative to a CPC-type optical concentrator, the LED optic can also have side walls 8 that extend in straight lines from radiation entrance opening b to radiation exit opening 5. The LED optic 4 can in this case be a solid body made of a dielectric material and possessing a basic shape in the nature of a truncated cone or a truncated pyramid. In addition, radiation exit opening 5 can be outwardly curved in the manner of a spherical, or aspherical lens, which forms an additional LED optic 9 that is part of the LED optic and is suitable for reducing the divergence of the radiation 3 passing through the optical element 4.

FIG. 4a shows a perspective view of the LED 20 according to a third exemplary embodiment of the LED 20.

In this exemplary embodiment, a plurality of LED chips 1 is arranged along a line on a carrier 2. Preferably four or live LED chips are arranged on the carrier 2.

The carrier 2 also comprises inner walls 2a disposed after the LED chips 1. Said inner walls 2a are preferably suitable for reflecting the radiation emitted by the LED chips 1. For this purpose, the carrier inner walls 2a either contain a reflective material or are reflectively coated. The inner walls 2a of the carrier form the LED optic 4 or are part of the LED optic 4. For example, inner walls 2a can be formed in the manner of a non-imaging optical concentrator, as described earlier hereinabove.

The carrier 2 is mounted on a circuit board 25, which is for example a metal-core board. The carrier 2 further comprises contact areas 21 via which the LED chips 1 can be electrically contacted. By means of conduction paths 27 on the circuit board 25, the contact areas 21 are connected to outer electrical contact areas 22. By means of a mating connector 23, the outer contact areas 22 can be contacted from the outside by means of a simple plug connection. In addition, at least one varistor 26 functioning as overvoltage protection for the LED chips 1 can be connected in parallel with the LED chips 1. The circuit board 25 can further comprise recesses 24 suitable for receiving dowel pins. In the exemplary embodiment shown, the recesses 24 are in the form of dowel holes.

FIG. 5a shows a perspective side view of a first exemplary embodiment of the lighting device described herein. FIG. 5b shows the corresponding front view.

Plural LED chips 20, as described for example in FIGS. 1, 3 or 4, are here mounted on a carrier 33. The carrier 33 preferably also serves as a heat sink for the heat generated by the LEDs 20 during operation. For example, the carrier 33 is provided for this purpose with cooling fins on its surface facing away from the LEDs 20. The carrier 33 preferably contains a metal that is a good thermal conductor, such as copper, for example.

The LEDs 20—of which there are three in this exemplary embodiment—and the carrier 33 can be aligned with one another by means of dowel pins 32. The LEDs 20 are also aligned with one another in this way. The dowel pins 32 can be separate components. The carrier 33 and the LED 20 then comprise recesses, for example dowel holes. The diameter of the dowel holes on the carrier 33 and on the LED 20 is such that the dowel pins 32 engage snugly in the dowel holes.

It is also possible for the dowel pins to be integral parts of the carrier 33. That is, the dowel pins are mechanically fixedly connected to the carrier 33. This can be done for example as early as during the production of the carrier 33. The circuit board 25 of the LED 20 then has recesses 24 suitable for receiving these dowel pins.

It is also possible for the dowel pins 32 to be integral parts of the LED 20. Recesses for receiving these dowel pins are then provided in the earner 33.

It is further possible for the carrier 33 and the LED 20 to be aligned with each other by means of register marks. The orientation of the LEDs 20 with respect to the carrier 33 and thus also the orientation of the LEDs 20 with respect to one other can then be performed for example by means of an image processing system. Register marks for this purpose are disposed for example on the circuit board 25 of the LED 20. The register marks can be detected by a camera and lined up with a reference point on the carrier 33. The reference point can be an additional register mark.

The register marks on the carrier 33 and the LED 20 are constituted either by markings or by certain elements of the components of the lighting device. For example, certain LED chips 1 of the LED 20 can represent such register marks.

In this exemplary embodiment, a common optical element 30 is disposed after the LEDs 2. Said optical element 30 is, for example, a diffractive or a refractive lens, which is disposed after all the LEDs 20 of the lighting device, so that light emitted by all the LEDs 20 is influenced by said optical element 30.

The optical element 30 and the earner 33 are aligned with each other by means of dowel pins 31. The LEDs 20 and the optical element 30 are also aligned with one another in this way.

The dowel pins 1 can be separate components. It is also possible, however, for the dowel pins 31 to be integral parts of the carrier 33 or the optical element 30. The respective other component is then provided with recesses—e.g. dowel holes—suitable for receiving the dowel pins 31.

Preferably after the mutual alignment of the LEDs 20 and the carrier 33 and of the optical element 30 and the carrier 33, the LEDs 20 are connected mechanically fixedly to the carrier. For example, the LEDs 20 can be glued, screwed or caulked to the carrier 33. The optical element 30, as well, is preferably connected mechanically fixedly to the carrier 33 after the alignment process.

FIG. 6a shows a perspective side view of a second exemplary embodiment of the lighting device. FIG. 6b shows the corresponding front view.

In contrast to the exemplary embodiments illustrated in FIGS. 5a and 5b, here an optical element 30 is assigned one-on-one to each LED 20. The optics 30 are, for example, refractive or diffractive lenses. The optics 30 and the carrier 33 to which the LEDs 20 are fixed are, again, aligned with one another by means of dowel pins 32.

Furthermore, another common optical element (not shown) can be disposed after the optics 30, in such a way that the system as a whole is configured as a two-stage optic. The alignment of the additional, common optic with the carrier 33 can be effected by means of dowel pins or an optical image processing system. The additional optic is, for example, one of the following optical elements: a diffractive optic, a refractive optic, a reflective optic, a holographic optic.

FIG. 7a shows a perspective side view of a third exemplary embodiment of the lighting device described herein. FIG. 7b shows the corresponding front view.

In contrast to the exemplary embodiment of FIGS. 6a and 6b, here a fiber optic 30 is disposed after the LEDs 20. In the case of this fiber optic 30, the light generated by the LED chips 1 couples into fibers of the light guide system. Preferably, each LED chip 1 couples light into exactly one fiber of the fiber optic, which fiber is assigned one-on-one to the LED chip 1. The fiber optic 30 and the carrier 33 can again be aligned with each oiler by means of dowel pins 32 and corresponding dowel holes.

FIG. 8a shows a perspective side view of a fourth exemplary embodiment of the lighting device described herein. FIG. 8b shows the corresponding front view.

In this exemplary embodiment, at least one LED 20 is mounted directly in a reflector 34. Preferably a plurality of LEDs 20 is mounted in the reflector 34. The LEDs 20 for example comprise dowel holes. The LEDs 20 are then aligned with the reflector 34 by means of dowel pins 32. The reflector 34 can additionally be aligned with a carrier 33 by means of the dowel pins.

An additional optical element 30 can be mounted on the reflector 34. This additional optical element 30 can be, for example, a refractive or diffractive optical element. The optical element 30 can be aligned with the reflector, and thus with the LEDs 20 fixed in the reflector, by means of dowel pins 31.

In all the exemplary embodiments, it is possible for at least one LED chip of the LEDs 20 to be suitable for emitting electromagnetic radiation in the near infrared region. The radiation emitted by the infrared LED chip can be used for example in the case of an optical detector employed in a night vision apparatus of a motor vehicle. For example, a photodiode can be installed in the front region of the motor vehicle to serve as a detector. The photodiode is for example fixed to the carrier 33 and contacted. The red fraction of the radiation emitted by the infrared LED chip can serve to increase the color rendition index of the white light emitted by the LEDs 20.

The invention is not limited by the description with reference to the exemplary embodiments. Rather, the invention encompasses any novel feature and any combination of features, including in particular any combination of features recited in the claims, even if that feature or combination itself is not explicitly mentioned in the claims or exemplary embodiments.

The invention claimed is:

1. A vehicle headlamp, comprising
at least one LED aligned with a carrier by means of at least a first dowel pin; and
at least one optical element aligned with the carrier by means of at least a second dowel pin,
wherein said LED and said optical element are aligned with each other by means of the first and second dowel pins;
wherein the first dowel pin does not align the optical element with the carrier and the second dowel pin does not align the LED with the carrier; and
wherein said optical element comprises an aperture region extending along an optical axis of the element and having a width corresponding to a radiation exit opening of the element, and wherein the first dowel pin is positioned within the aperture region.

2. The vehicle headlamp as in claim 1, comprising a plurality of LEDs and a plurality of optical elements, wherein for each LED, an optical element is disposed after the LED along a direction defined by light emitted from the LED.

3. The vehicle headlamp as in claim 1, comprising a plurality of LEDs and a common optical element, wherein the common optical element is disposed after each of the plurality of LEDs along a direction defined by light emitted from the LEDs.

4. The vehicle headlamp as in claim 1, wherein said optical element is formed at least in part by a fiber optic.

5. The vehicle headlamp as in claim 4, wherein the light emitted by a said LED chip is coupled into exactly one fiber of said fiber optic.

6. The vehicle headlamp as in claim 1, wherein said second dowel pin is an integral part of said optical element.

7. The vehicle headlamp as in claim 1, wherein said optical element comprises at least one recess suitable for receiving said second dowel pin.

8. The vehicle headlamp as in claim 1, wherein said optical element is arranged on said carrier.

9. The vehicle headlamp as in claim 8, wherein said second dowel pin is an integral part of said carrier.

10. The vehicle headlamp as in claim 8, wherein said carrier comprises at least one recess suitable for receiving said second dowel pin.

11. The vehicle headlamp as in claim 1, wherein said LED is mounted on said carrier.

12. The vehicle headlamp as in claim 11, wherein said first dowel pin is an integral part of said LED.

13. The vehicle headlamp as in claim 11, wherein said first dowel pin is an integral part of said carrier.

14. The vehicle headlamp as in claim 11, wherein said LED comprises at least one recess suitable for receiving said first dowel pin.

15. The vehicle headlamp as in claim 11, wherein said carrier comprises at least one recess suitable for receiving said first dowel pin.

16. The vehicle headlamp as in claim 15, wherein said LED and said carrier are aligned with each other by means of at least one register mark.

17. The vehicle headlamp as in claim 1, wherein said LED comprises at least one LED chip with an LED optic.

18. The vehicle headlamp as in claim 17, wherein said LED optic is suitable for reducing a divergence of light emitted by said LED chip.

19. The vehicle headlamp as in claim 17, wherein said LED optic is a non-imaging optical concentrator.

20. The vehicle headlamp as in claim 19, wherein said LED optic is formed at least in part in the manner of one of the following optical elements: a Compound Parabolic Concentrator, a Compound Elliptical Concentrator, a Compound Hyperbolic Concentrator, a truncated pyramid, a truncated cone.

21. The vehicle headlamp as in claim 17, wherein said LED optic comprises a radiation entrance opening that is no more than twice as large as a total radiation outcoupling area of said at least one LED chip of said LED.

22. The vehicle headlamp as in claim 1, wherein said LED comprises a thin-film LED chip.

23. The vehicle headlamp as in claim 1, wherein a length of the second dowel pin is greater than a length of the first dowel pin.

24. The vehicle headlamp as in claim 1, wherein the LED is mounted within a reflector.

25. The vehicle headlamp as in claim 24, wherein the LED is oriented so that an optical axis of the optical element is perpendicular to a surface of the LED through which light is principally emitted.

* * * * *

UNITED STATES PATENT AND TRADEMARK OFFICE
CERTIFICATE OF CORRECTION

PATENT NO. : 8,439,529 B2  
APPLICATION NO. : 11/718009  
DATED : May 14, 2013  
INVENTOR(S) : Moritz Engl et al.

Page 1 of 1

It is certified that error appears in the above-identified patent and that said Letters Patent is hereby corrected as shown below:

In the Specification:

Column 1  
Line 10, delete "of" and insert -- to --  
Line 11, delete "10 200452687.7," and insert -- 10 2004052687.7, --

Signed and Sealed this  
Twentieth Day of August, 2013

Teresa Stanek Rea  
*Acting Director of the United States Patent and Trademark Office*